United States Patent [19]
Tung

[11] Patent Number: 6,037,600
[45] Date of Patent: Mar. 14, 2000

[54] SAFETY GAS CONTROLLING SYSTEM

[76] Inventor: Kung Chao Tung, No. 24, Chitung St., Taipei, Taiwan

[21] Appl. No.: 09/115,684

[22] Filed: Jul. 15, 1998

[51] Int. Cl.[7] ........................................................ H01J 49/00
[52] U.S. Cl. ............................... 250/492.21; 250/423 R
[58] Field of Search ........................... 250/492.21, 423 R

[56] References Cited

U.S. PATENT DOCUMENTS 4,883,969  11/1989  Ishida et al. .......................... 250/423 R

*Primary Examiner*—Kiet T. Nguyen
*Attorney, Agent, or Firm*—Birch, Stewart, Kolasch & Birch, LLP

[57] ABSTRACT

Disclosed is a safety gas controlling system utilizing a vacuum transducer to detect the pressure of gas transmitted to an ion implantor. If the gas pressure is lower than a predetermined value, an electronic temperature controller starts to operate a heater to heat a safety delivery source cylinder (SDSC), and at the same time heating temperature is fed back with a signal to the electronic temperature controller by a temperature sensor so as to maintain a stable gas pressure. The gas stored in the SDSC expands by heating and the gas is transmitted under an increased but stabilized pressure resulting in minimizing the amount of residual gas in the SDSC.

4 Claims, 3 Drawing Sheets

SAFETY GAS CONTROLLING SYSTEM

BACKGROUND OF THE INVENTION

1. Field of the Invention

The present invention relates to a safety gas controlling system and more particularly to a safety gas controlling system which can stabilize the inner gas pressure and also minimize the amount of residual gas contained by efficiently utilizing the gas in the container.

2. Description of the Prior Art

In manufacturing semi-conductor devices, a safe delivery source cylinder (SDSC) is generally used to reserve poisonous and corrosive gases such as boron fluoride (BF3), hydrogen phosphate (PH3), and hydrogen arsenate (As H3) which are injected into cylinder in vacuum state for use in an ion implantation source. Furthermore, in the conventional technique, a pressure difference between inner and outer gas pressures of a cylinder is used to deliver the gas in a cylinder for ion implantation. For example, when a SDSC is full of a gas with a pressure which is larger than the pressure in an ion implantation source, the gas reserved in the SDSC may flow into the vacuum ion implantation source by way of a gas transmitting device. But until the amount of residual gas in the SDSC is decreased to 30% of its initial amount, it is hard to deliver the gas any more from the SDSC. This residual gas can not be used and results in waste of material.

In order to improve the above described shortcomings existing in the conventional SDSC's, the inventor of the present invention has succeeded in developing a safety gas controlling system through a long term study, and it is now will be disclosed herein below.

SUMMARY OF THE INVENTION

It is an object of the present invention to provide a safety gas controlling system which can increase the amount of gas deliverable from the container than that of a conventional type so as to effectively save gas wasting and an additional cost for preventing environmental contamination which may otherwise be caused by residual gas in the container.

It is another object of the present invention to provide a safety gas controlling system which can maintain a stable gas transmitting pressure for an ion implantation source.

To achieve these and other objects, a safety gas controlling system of the present invention comprises; a SDSC for storing the working gas required for the ion implantor; a gas transmitting device for transmitting the working gas stored in the SDSC into the ion implantation source; a vacuum transducer installed in the gas transmitting device for detecting the gas pressure in the gas transmitting device and producing a pressure signal; a heater for heating the gas stored in the SDSC; a temperature sensor for detecting the temperature of the SDSC so as to produce a temperature signal; an electronic temperature controller for receiving the pressure signal and the temperature signal. The heater is started to operate if the pressure signal received is lower than a predetermined value so as to heat up the SDSC and increase the working gas pressure thereof. The temperature sensor is also used for monitoring the temperature rise of the SDSC in order to stop the operation of the heater if the temperature of the SDSC is higher than a predetermined value so as to assure the SDSC to be kept under a safety temperature. The temperature sensor can further provide information if the cylinder has to be replaced.

BRIEF DESCRIPTION OF THE DRAWINGS

The drawings disclose an illustrative embodiment of the present invention which serves to exemplify the various advantages and objects hereof, and are as follows.

Numeral Representation of the Principal Parts:

| | |
|---|---|
| 100 safe delivery source cylinder | 105 cylinder valve |
| 110 gas cylinder isolation outlet | 115 purge gate |
| 120 gas filter | 125 vacuum transducer |
| 135 gas on/off valve | 140 purge gate |
| 145 mass flow controller | |
| 150 switch for gas feed to ion implantation source | |
| 160 electronic temperature controller | 155 purge gate |
| 170 heater | 165 temperature sensor |
| 180 gas inlet to ion implantor. | |

DETAILED DESCRIPTION OF THE PREFERRED EMBODIMENT

Figure 1:
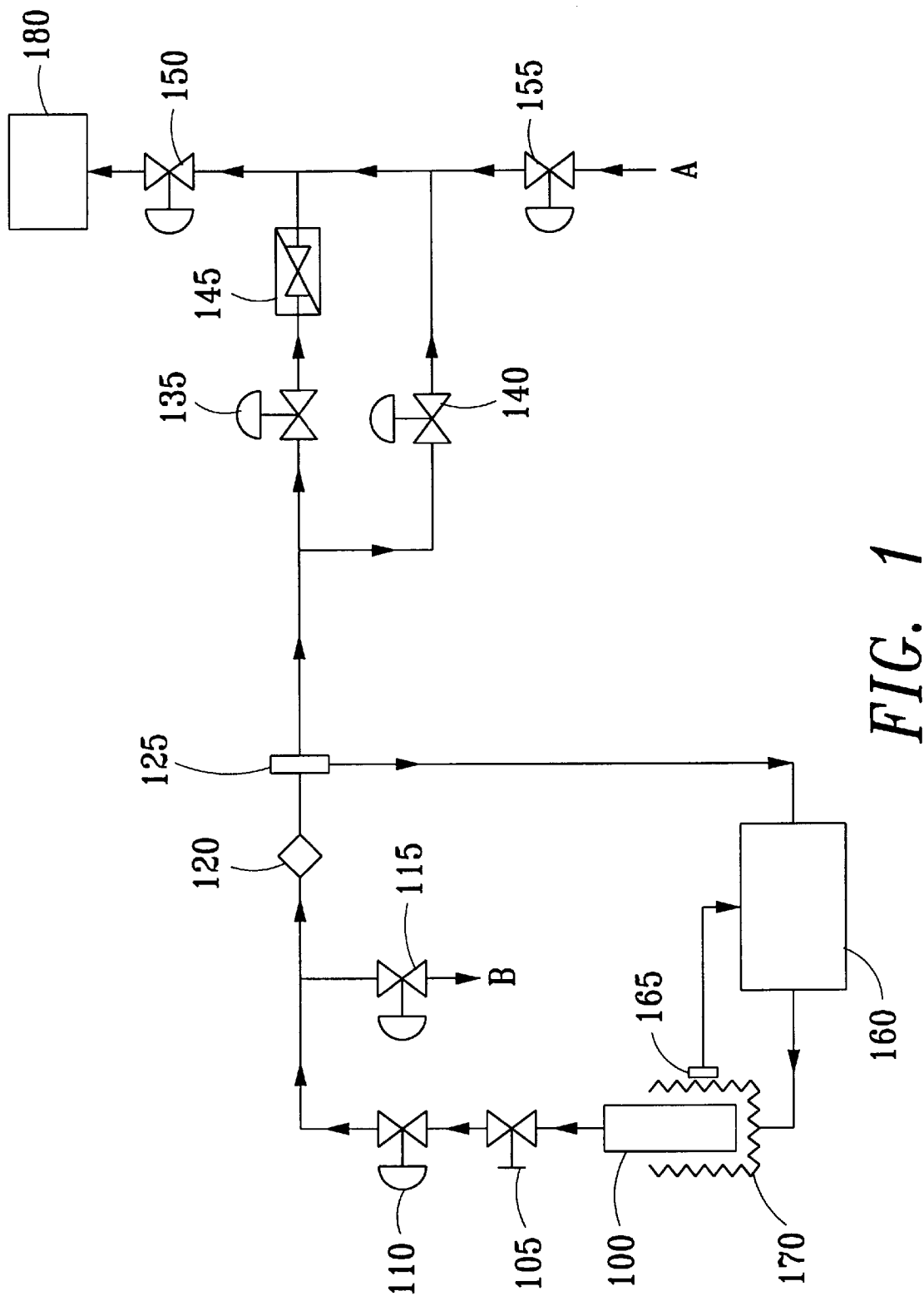
FIG. 1 is an skematic drawing showing how the gas stored in the safety gas controlling system of the present invention is transmitted to an ion implantation source.

Referring to FIG. 1 which shows how the gas stored in the safety gas controlling system of the present invention is transmitted to an ion implantor source, at first, a cylinder valve 105 of a SDSC 100 which being connected to a gas cylinder isolation outlet 110 is opened, at this time a gas transmitting device is ready for transmitting the gas to an ion implantor.

Accordingly, the gas is able to flow into the ion implantor by way of a gas passage passing a gas filter 120, a vacuum transducer 125,, a gas on/off valve 135, a mass flow controller 145 for controlling the amount of gas to be supplied to the ion implantor, a valve 150 for gas feed to the ion implantor, and finally reaching a gas inlet to ion implantor source head 180. As the gas pressure in the SDSC has gradually reduced to a value which makes the gas transmitting device unable to transmit the gas to feed the ion implant, the low gas pressure is detected by the vacuum transducer 125 which sends a signal to an electronic temperature controller 160, and which in turn starts a heater 170 to operate and heat up the SDSC 100, then the gas pressure in the system is increased. Another temperature sensor 165 installed in the heater 170 is for detecting the temperature of the SDSC 100. When the temperature sensed by the sensor 165 exceeds a predetermined value which results in the gas pressure in the system being increased to a required pressure, the electronic temperature controller 160 interrupts the operation of the heater 170 to stop heating the SDSC 100. The electronic temperature controller 160 may further provide an information to replace the SDSC 100 by receiving an alarm from the temperature sensor 165 if the temperature of the SDSC 100 is higher than a predetermined value.

In the safety gas controlling system of the present invention inert gas is passing from A and B via purge gate 155, 140 and 115 and 150 to attain the purpose of cleaning the tubing system.

Figure 2:
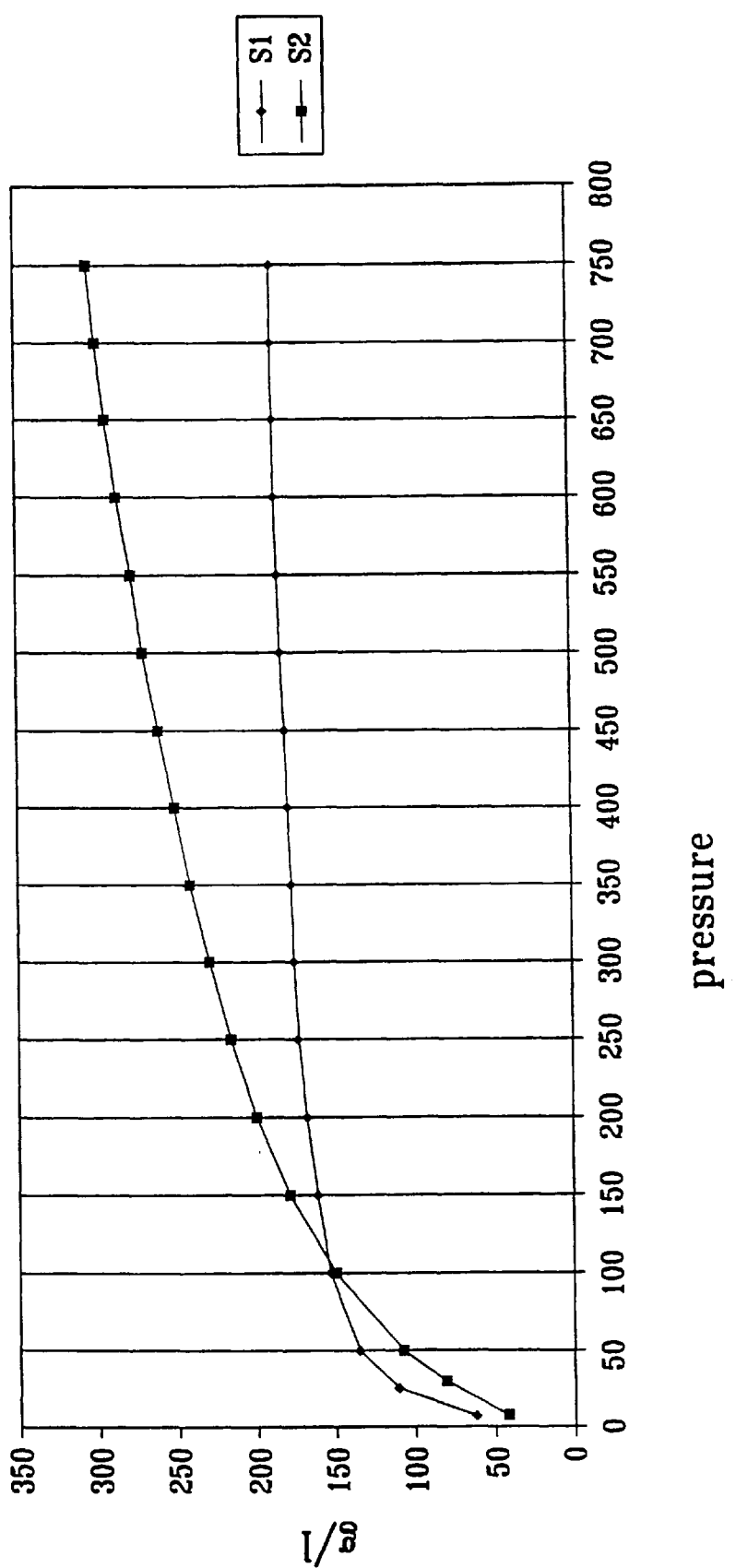
FIG. 2 is a table showing the relationship between the output and the pressure of hydrogen arsenic gas.
Figure 3:
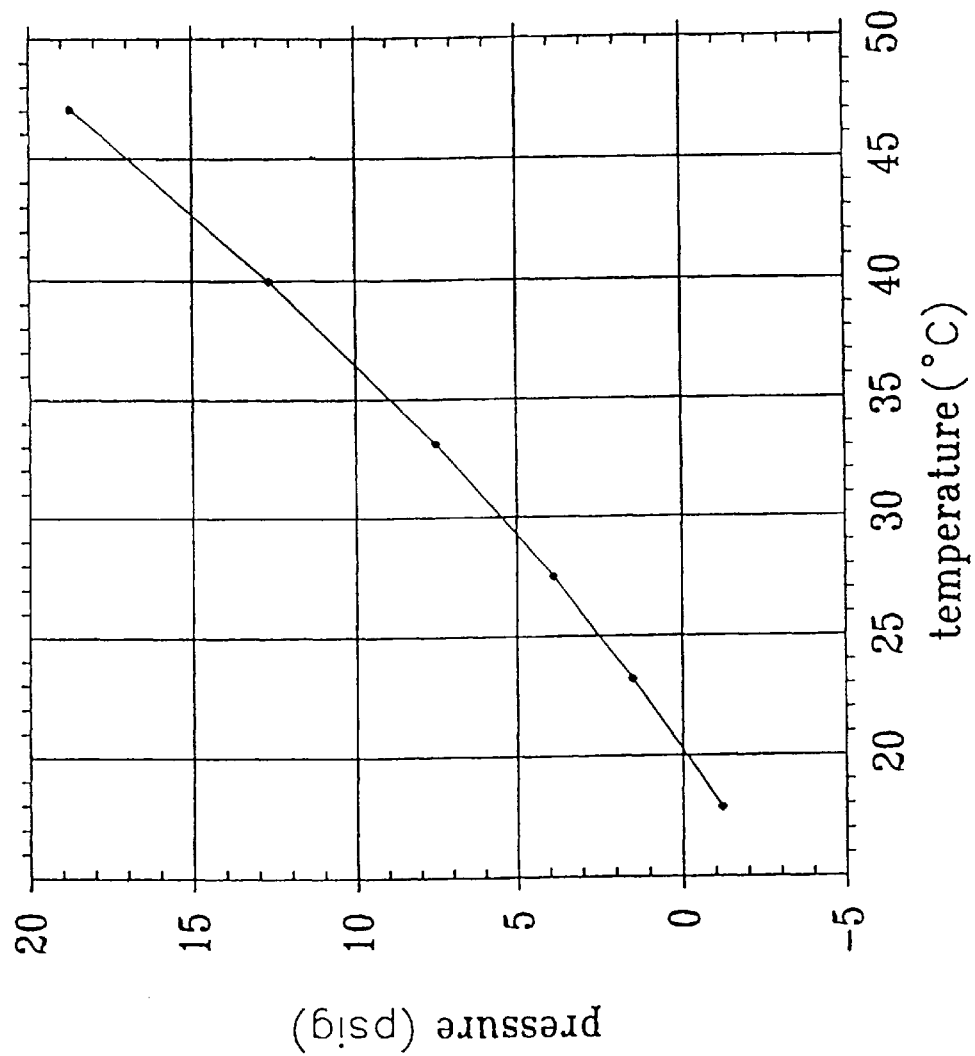
FIG. 3 is a table showing the relationship between the pressure and the temperature of hydrogen arsenic gas.

Referring to the FIG. 2 showing the relationship between the output and the pressure of hydrogen arsenic gas. However, in the system of the present invention, when a gas pressure in the SDSC is measured to be 50~150 torr by use of the vacuum pressure transducer 125, the heater 170 may be set forth to operate by the electronic control described above. A stable and secure temperature and pressure can be maintained by accurate detection of the temperature sensor 165.

Referring to the FIG. 2 showing the relationship between the pressure and the temperature of hydrogen arsenic gas, the graph shows Clear an approximate linearly proportional relation between pressure and temperature. Accordingly, most part of the gas in a SDSC may be forced to flow out if heating increases its temperature.

In conclusion, the safety gas controlling system of the present invention has many advantages compared with conventional techniques; the most significant ones are;

1. A heater is installed to heat the SDSC when necessary, providing a stable gas pressure.

2. An electronic temperature controller with a temperature sensor is equipped so that the entire heating procedure of a SDSC is under strict control resulting in enhancing security and stability of the system.

3. An improved utilization of residual gas in a SDSC can prevent environment from being contaminated and reduce the material cost as well.

Many changes and modifications in the above-described embodiment of the invention can, of course, be carried out without departing from the scope thereof Accordingly, to promote the progress in science and the useful arts, the invention is disclosed and is intended to be limited only by the scope of the appended claimed.

What is claimed is:

1. A safety gas controlling system comprising:

a safe delivery source cylinder (SCSC) for storing the working gas required for the ion implantation source;

a gas transmitting device for transmitting said working gas stored in said SDSC into the ion implantation source;

a vacuum transducer installed in said gas transmitting device for detecting the gas pressure in said gas transmitting device and producing a pressure signal;

a heater for heating the gas stored in said SDSC; and an electronic temperature controller for receiving said pressure signal, if said pressure signal received is lower than a predetermined value, said heater is started to operate so as to heat up said SDSC and increase said working gas pressure therein.

2. The safety gas controlling system as claimed in claim 1, further comprising a temperature sensor for detecting the temperature of said SDSC and delivering a temperature signal to said electronic temperature controller so as to monitor the temperature rise of said SDSC, and further provide message as to whether said SDSC is going to be replaced or not.

3. The safety gas controlling system as claimed in claim 1, wherein said vacuum transducer can measure a gas pressure ranging between 50 torr to 150 torr for use with said electronic temperature controller.

4. The safety gas controlling system as claimed in claim 2, wherein said electronic temperature controller is to be used with said vacuum transducer.

* * * * *